(12) United States Patent
Gleason et al.

(10) Patent No.: US 9,656,294 B2
(45) Date of Patent: May 23, 2017

(54) FABRICATION AND PASSIVATION OF SILICON SURFACES

(71) Applicants: Massachusetts Institute of Technology, Cambridge, MA (US); Shirley Segal, Hasharon (IL)

(72) Inventors: Karen K. Gleason, Cambridge, MA (US); Rong Yang, Cambridge, MA (US); Yaron Segal, Cambridge, MA (US); Tonio Buonassisi, Cambridge, MA (US); Baby Reeja Jayan, Boston, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 557 days.

(21) Appl. No.: 14/085,275

(22) Filed: Nov. 20, 2013

(65) Prior Publication Data
US 2014/0186620 A1 Jul. 3, 2014

Related U.S. Application Data

(60) Provisional application No. 61/728,601, filed on Nov. 20, 2012.

(51) Int. Cl.
*B05D 1/00* (2006.01)
*H01L 31/18* (2006.01)
*H01L 21/02* (2006.01)

(52) U.S. Cl.
CPC .......... *B05D 1/60* (2013.01); *H01L 21/02118* (2013.01); *H01L 21/02271* (2013.01); *H01L 31/1868* (2013.01); *Y02E 10/50* (2013.01); *Y02P 70/521* (2015.11); *Y10T 428/265* (2015.01)

(58) Field of Classification Search
CPC .............................. B05D 1/60; H01L 31/1868
See application file for complete search history.

(56) References Cited

U.S. PATENT DOCUMENTS

| | | | | |
|---|---|---|---|---|
| 5,270,424 A | * | 12/1993 | Drake | C07F 7/0801 528/15 |
| 5,429,708 A | * | 7/1995 | Linford | B05D 1/185 216/66 |
| 5,888,591 A | * | 3/1999 | Gleason | B05D 1/62 257/E21.264 |

(Continued)

FOREIGN PATENT DOCUMENTS

EP 1 146 968 B2 10/2001

OTHER PUBLICATIONS

International Preliminary Report on Patentability mailed Jun. 4, 2015 in connection with Application No. PCT/US2013/070984.

(Continued)

*Primary Examiner* — Liam J Heincer
(74) *Attorney, Agent, or Firm* — Wolf, Greenfield & Sacks, P.C.

(57) ABSTRACT

Embodiments described herein are related to methods for processing substrates such as silicon substrates. In some cases, the method may provide the ability to passivate a silicon surface at relatively low temperatures and/or in the absence of a solvent. Methods described herein may be useful in the fabrication of a wide range of devices, including electronic devices such as photovoltaic devices, solar cells, organic light-emitting diodes, sensors, and the like.

20 Claims, 9 Drawing Sheets

(56) References Cited

U.S. PATENT DOCUMENTS

| | | | | |
|---|---|---|---|---|
| 6,086,679 A * | 7/2000 | Lee | B05D 1/60 | 118/715 |
| 6,485,986 B1 * | 11/2002 | Buriak | C07K 17/14 | 205/420 |
| 2002/0127326 A1 | 9/2002 | Boukherroub et al. | | |
| 2003/0219535 A1 | 11/2003 | Chang et al. | | |
| 2004/0185480 A1 * | 9/2004 | Kim | B01L 3/508 | 435/6.12 |
| 2005/0020845 A1 * | 1/2005 | Suzuki | C07F 7/1876 | 556/470 |
| 2005/0054215 A1 * | 3/2005 | Buriak | H01L 21/306 | 438/780 |
| 2005/0227055 A1 * | 10/2005 | Senkevich | B05D 1/60 | 428/214 |
| 2006/0088666 A1 * | 4/2006 | Kobrin | B05D 1/60 | 427/569 |
| 2006/0131565 A1 * | 6/2006 | Lewis | C08G 61/02 | 257/40 |
| 2006/0228966 A1 * | 10/2006 | Gleason | A61L 15/24 | 442/123 |
| 2006/0251795 A1 * | 11/2006 | Kobrin | A61L 27/34 | 427/2.1 |
| 2006/0269664 A1 * | 11/2006 | Gleason | B05D 1/60 | 427/248.1 |
| 2007/0032620 A1 * | 2/2007 | Gleason | C09D 4/00 | 526/217 |
| 2007/0104860 A1 * | 5/2007 | Gleason | A61K 9/2077 | 427/2.14 |
| 2008/0000521 A1 * | 1/2008 | Sivoththaman | C30B 25/02 | 136/254 |
| 2008/0315270 A1 * | 12/2008 | Marsh | B32B 25/00 | 257/292 |
| 2009/0029178 A1 * | 1/2009 | Smith | C23C 16/24 | 428/446 |
| 2010/0221188 A1 | 9/2010 | Clark et al. | | |
| 2012/0296033 A1 * | 11/2012 | Gleason | C09D 139/00 | 524/549 |
| 2012/0313199 A1 * | 12/2012 | Orita | C08K 3/22 | 257/431 |
| 2013/0040102 A1 * | 2/2013 | Gleason | B05D 7/52 | 428/141 |
| 2013/0171546 A1 * | 7/2013 | White | B05D 1/60 | 429/508 |
| 2013/0189807 A1 * | 7/2013 | Gleason | H01L 51/0008 | 438/46 |
| 2013/0244008 A1 * | 9/2013 | Wardle | B05D 1/60 | 428/195.1 |
| 2013/0260054 A1 * | 10/2013 | Gleason | C23C 16/042 | 427/509 |
| 2013/0280442 A1 * | 10/2013 | Gleason | B05D 1/60 | 427/586 |
| 2014/0314982 A1 * | 10/2014 | Paxson | B05D 5/08 | 428/35.7 |
| 2014/0370300 A1 * | 12/2014 | Smith | B05D 1/60 | 428/422 |
| 2016/0074915 A1 * | 3/2016 | White | B05D 5/08 | 428/141 |
| 2016/0097125 A1 * | 4/2016 | Tavares | C23C 16/30 | 428/407 |

OTHER PUBLICATIONS

Invitation to Pay Additional Fees mailed Apr. 10, 2014 for PCT/US2013/070984.

International Search Report and Written Opinion mailed Aug. 25, 2014 for PCT/US2013/070984.

Alf et al. Chemical vapor deposition of conformal, functional, and responsive polymer films. Adv Mater. 2010; 22:1993-2027.

Baxamusa et al. Initiated and oxidative chemical vapor deposition: a scalable method for conformal and functional polymer films on real substrates. Physical Chemistry Chemical Physics. 2009; 11(26):5227-5240.

Ciampi et al. Wet chemical routes to the assembly of organic monolayers on silicon surfaces via the formation of Si—C bonds: surface preparation, passivation and functionalization. J Chem Soc Rev. 2010; 39:2158-2183.

Im et al. Solvent-free modification of surfaces with polymers: The case for initiated and oxidative chemical vapor deposition (CVD). AIChE Journal. 2011; 57(2):276-285.

Ozaydin-Ince et al. Journal of Vacuum Science & Technology A: Vacuum, Surfaces, and Films 2009; 27(5):1135-1143.

Tenhaeff et al. Initiated and oxidative chemical vapor deposition of polymeric thin films: iCVD and oCVD. Advanced Functional Materials. 2008; 18(7):979-992.

Vilan et al. Molecules on Si: Electronics with chemistry. Adv Mater. 2010; 22:140-159.

Yague et al. Systematic control of mesh size in hydrogels by initiated chemical vapor deposition. Soft Matter. 2012; 8(10):2890-2894.

Yang et al. Surface-tethered zwitterionic ultrathin antifouling coatings on reverse osmosis membranes by initiated chemical vapor deposition. Chem. Mater. 2011; 23(5):1263-1272.

Yang et al. Organic vapor passivation of silicon at room temperature. Poster presentation, Boston, MA; Nov. 25-30, 2012. 1 page.

Yang et al. Organic vapor passivation of silicon at room temperature. Adv. Mat. 2013; 25:2078-2083.

PCT/US2013/070984, Nov. 20, 2013, Invitation to Pay Additional Fees.

* cited by examiner

| Surface Chemistry | Surface Recombination Velocity [cm s$^{-1}$] | Stability in Ambient Air | Fabrication Conditions | Typical thickness [nm] |
| --- | --- | --- | --- | --- |
| Untreated SiO$_x$ [24] | ~10$^5$ | √ | N.A. | 20–120nm |
| SiN$_x$ [5] | 10-10$^3$ | √ | PECVD with T$_{substrate}$~375°C | 65–150nm |
| Si-H [10] | <1 | X | HF Etching | Monolayer |
| Ultra-thin SiO$_x$ [25] | ~3 | √ | Controlled oxidization and annealing at T$_{substrtae}$ ~1050°C | N.A. |
| Si-OCH$_2$CH$_3$ [10] | ~10 | X | HF etching- I$_2$/EtOH | Monolayer |
| Si-CH$_3$ [9] | <25 | √ | Solution fabrication under stringent limitation of ambient air and water | Monolayer |
| iCVD method | ≤10 | √ | HF-iCVD | 200nm – 700nm |

FIG. 1

FABRICATION AND PASSIVATION OF SILICON SURFACES

RELATED APPLICATIONS

This application claims priority under 35 U.S.C. §119(e) to U.S. Provisional Application Ser. No. 61/728,601, filed Nov. 20, 2012, the contents of which are incorporated herein by reference in its entirety for all purposes.

FIELD OF THE INVENTION

Embodiments described herein generally relate to the processing of substrates, including silicon substrates.

BACKGROUND OF THE INVENTION

Passivation to reduce the surface recombination of minority carriers is of key importance for improving photovoltaic efficiency, especially for thin devices. High quality electronic passivation is achieved for surface recombination velocities (SRV)≤10 cm s-1. (FIG. 1) Chemical vapor deposition (CVD) is currently used in industry to deposit 65-150 nm thick SiNx, which also acts as an anti-reflective coating (ARC). The high temperature of the SiNx degrades the quality of the bulk Si and raises operational costs.

By contrast, low temperature processing retains organic functionalities, enabling the fabrication of hybrid or multifunctional devices. Protocols for organic passivation typically start with chemical etching of the native silicon oxide to obtain H-terminated Si surfaces. The Si—H bonds are subsequently activated by various solution methods. Most organic passivations rely on monolayer coverage rather than on producing layers with nano-scale thickness, as is the case for SiNx passivation. A two-step chlorination/alkylation scheme produces low air-stable SRV among organic passivations; however, the time-consuming process and stringent limitations on ambient water and oxygen contents have hindered its industrial application. Ethanol-iodine (E-I) passivation produces SRV ~10 cm s-1, but this value increases to $10^3$ cm s-1 within minutes in air. E-I still serves as a good reference for high-quality passivation due to its ease of preparation.

SUMMARY OF THE INVENTION

Methods for passivating a substrate are provided. In some embodiments, the method comprises exposing a surface of a substrate comprising silicon-hydride groups to a vapor-phase initiator species under conditions which facilitate a radical reaction between at least a portion of the silicon-hydride groups and the vapor-phase initiator species.

In some embodiments, the method comprises forming a polymer material on the surface of a substrate comprising silicon-hydride groups by exposure of the substrate to a monomeric species at a temperature of about 500° C. or less, wherein the polymer material is covalently bonded to the surface of the substrate.

In some embodiments, the method comprises forming a polymer material on the surface of a substrate comprising silicon-hydride groups by exposure of the substrate to a monomeric species in the absence of a solvent, wherein the polymer material is covalently bonded to the surface of the substrate.

BRIEF DESCRIPTION OF THE DRAWINGS

FIG. 1 shows a table of SRV of various passivation techniques.

Figure 2:
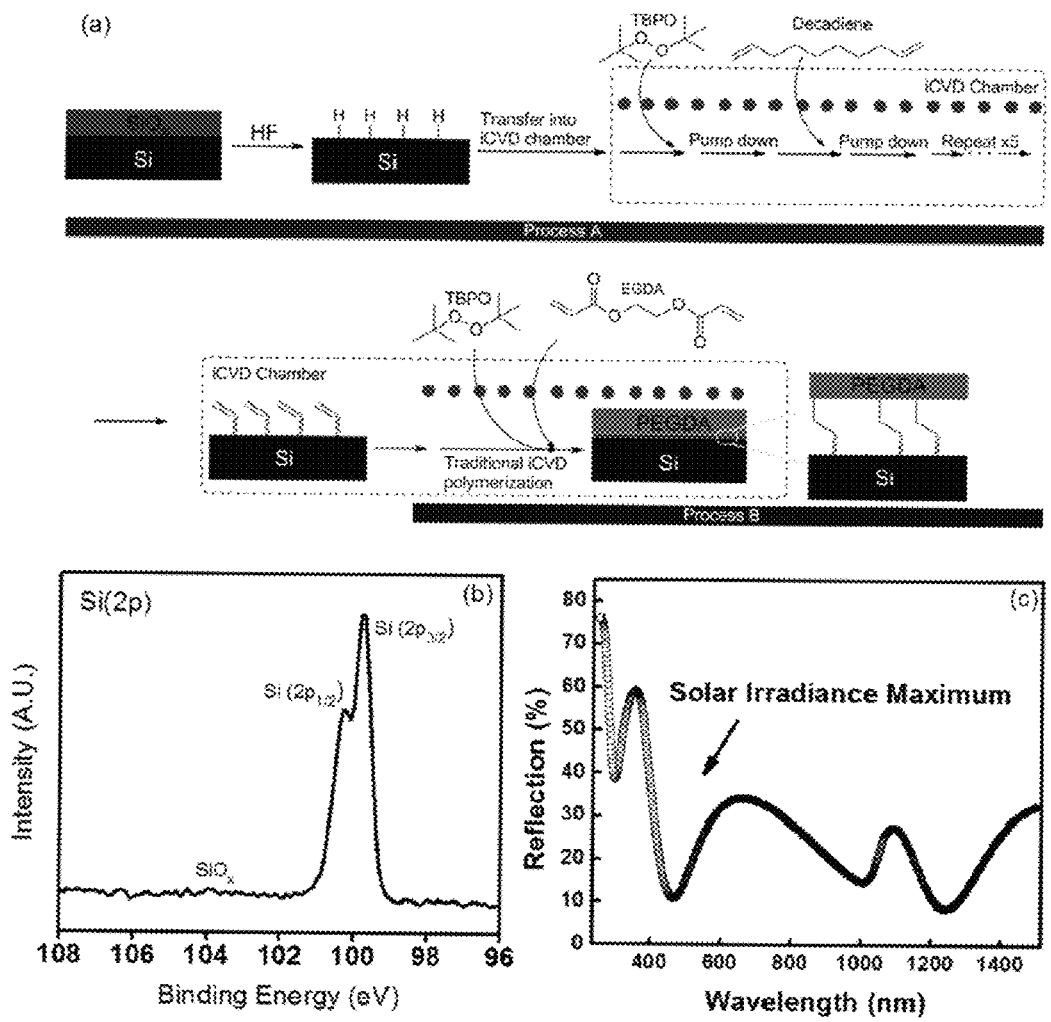
FIG. 2 shows (a) a schematic representation of a passivation procedure according to one embodiment; (b) an Si (2p) XPS spectrum of the surface resulting from Process A in part (a); and (c) a reflection spectrum of the surface resulting from Process B in part (a).

Other aspects, embodiments and features of the invention will become apparent from the following detailed description when considered in conjunction with the accompanying drawings. The accompanying figures are schematic and are not intended to be drawn to scale. For purposes of clarity, not every component is labeled in every figure, nor is every component of each embodiment of the invention shown where illustration is not necessary to allow those of ordinary skill in the art to understand the invention. All patent applications and patents incorporated herein by reference are incorporated by reference in their entirety. In case of conflict, the present specification, including definitions, will control.

DETAILED DESCRIPTION

Embodiments described herein are related to methods for processing substrates such as silicon substrates. In some cases, the method may provide the ability to passivate a substrate (e.g., silicon surface) at relatively low temperatures (e.g., room temperature) and/or in the absence of a solvent. Methods described herein may be useful in the fabrication of a wide range of devices, including electronic devices such as photovoltaic devices, solar cells, organic light-emitting diodes, sensors, and the like.

An advantageous feature of the methods described herein is the ability to fabricate electronic devices which include an organic material (e.g., an organic passivation material). Such methods allow for access to a wide range of devices, as organic materials can readily be synthesized or otherwise processed to exhibit a particular desired property. For example, the thickness of the organic material may be selected such that the material exhibits anti-reflective properties. In some cases, a conducting organic material may be incorporated into the device. In some cases, an insulating organic material may be incorporated into the device. In another example, the organic material may be readily modulated to include a wide variety of functional groups, including groups that may interact with a chemical or biological analyte. For example, the organic material may include a group capable of specifically recognizing a biomolecule or toxin, as described more fully below. In some cases, the device includes an organic polymeric material.

Some embodiments provide methods for passivating a surface of a substrate, such a silicon substrate. The method typically involves exposure of a surface of a substrate including silicon-hydride groups (i.e., Si—H groups) to various species under conditions which facilitate reaction of those species with the silicon-hydride groups. For example, the substrate may be exposed to a species capable of activating the silicon-hydride groups for further reaction and/or a species capable of forming a polymer material attached (e.g., covalently attached) to the substrate. In some embodiments, the species may be in vapor phase.

In some embodiments, the substrate may be exposed to an initiator species under conditions which facilitate a reaction (e.g., radical reaction) between at least a portion of the silicon-hydride groups and the initiator species. Such a reaction may activate the substrate surface for further reaction with additional reagents. In one set of embodiments, the initiator species reacts with silicon-hydride groups of the substrate via a radical reaction. In some cases, the radical reaction comprises hydride extraction from the silicon-hydride groups, producing silicon radicals. As an illustrative embodiment, tert-butyl peroxide (TBPO) may react with a silicon-hydride group via a radical reaction to produce a silicon radical, methane, and acetone. Those of ordinary skill in the art would be capable of selecting additional types of initiator species suitable for producing a particular radical species.

The method may also involve exposure of the substrate to a monomer species to form a polymer material at the surface of the substrate. The monomer species may, for example, form a bond with a moiety on the surface of the substrate, and may be further polymerized to produce a polymer material covalently attached to the substrate. In some embodiments, the substrate may be exposed to more than one type of monomer species, either simultaneously or sequentially.

In some cases, the initiator species and monomer species are exposed to the substrate simultaneously. In some cases, the initiator species and monomer species are exposed to the substrate sequentially. For example, in cases where it may be desirable to react a greater amount of the silicon-hydride groups with an initiator species prior to formation of the polymer, the initiator species and monomer species may be exposed to the substrate sequentially.

An advantageous feature of methods described herein is the ability to process various substrates (e.g., silicon substrates) in the absence of a solvent (e.g., organic solvents, inorganic solvents). For example, a silicon substrate including silicon-hydride groups may be exposed to various reagents (e.g., initiator species, monomer species) in the vapor phase without need for the use of solvents.

Also, methods described herein may advantageously be carried out at relatively low temperatures (e.g., less than 500° C.). In some cases, exposure of the substrate to an initiator species and/or a monomeric species may be performed at a temperature of about 500° C. or less, about 450° C. or less, about 400° C. or less, about 350° C. or less, about 300° C. or less, about 250° C. or less, about 200° C. or less, about 150° C. or less, about 100° C. or less, about 75° C. or less, about 50° C. or less, or about 25° C. or less. In some embodiments, the substrate is exposed to a initiator species and/or a monomeric species at a temperature in the range of about 25° C. to about 500° C., about 25° C. to about 400° C., about 25° C. to about 300° C., about 25° C. to about 200° C., about 25° C. to about 100° C., or about 25° C. to about 50° C. In a particular embodiment, the substrate is exposed to a initiator species and/or a monomeric species at a temperature of about 25° C. (e.g., room temperature).

In some cases, the polymer material formed on the surface of the substrate may have a sufficient thickness so as to exhibit desirable properties including anti-reflective properties. In some cases, the polymer material has a thickness in the range of about 10 nm to about 10 microns, 20 nm to about 10 microns, 100 nm to about 10 microns, 100 nm to about 1 micron, 200 nm to about 1 micron, about 300 nm to about 1 micron, 400 nm to about 1 micron, about 500 nm to about 1 micron, 600 nm to about 1 micron, about 700 nm to about 1 micron, about 800 nm to about 1 micron, about 900 nm to about 1 micron, or greater. Those of ordinary skill in the art would be capable of selecting the appropriate set of conditions (e.g., monomer species, reaction time, reaction temperature, etc.) suitable for producing a polymer material with a particular thickness.

In some embodiments, the polymer materials described herein may be functionalized with a group (e.g., binding site) capable of interacting with a chemical or biological analyte. Such materials may be useful in the fabrication of sensors. For example, a sample suspected of containing an analyte may be exposed to a polymer material as described herein, and the analyte may interact with the polymer material to produce a signal that may determine the analyte. As used herein, the term "determination" or "determining" generally refers to the analysis of a species or signal, for example, quantitatively or qualitatively, and/or the detection of the presence or absence of the species or signals. "Determination" or "determining" may also refer to the analysis of an interaction between two or more species or signals, for example, quantitatively or qualitatively, and/or by detecting the presence or absence of the interaction.

In some embodiments, the interaction between the analyte and the polymer material may comprise formation of a bond, such as a covalent bond (e.g. carbon-carbon, carbon-oxygen, oxygen-silicon, sulfur-sulfur, phosphorus-nitrogen, carbon-nitrogen, metal-oxygen or other covalent bonds), an ionic bond, a hydrogen bond (e.g., between hydroxyl, amine, carboxyl, thiol and/or similar functional groups, for example), a dative bond (e.g. complexation or chelation between metal ions and monodentate or multidentate ligands), or the like. The interaction may also comprise Van der Waals interactions. In one embodiment, the interaction comprises forming a covalent bond with an analyte. The polymer material may also interact with an analyte via a binding event between pairs of biological molecules. For example, the polymer material may comprise a group, such as biotin, that specifically binds to a complementary entity, such as avidin or streptavidin, on a target analyte.

In some cases, the polymer material may comprise a biological or a chemical molecule able to bind to another biological or chemical molecule in a medium (e.g., solution, vapor phase, solid phase). For example, the polymer material may include a functional group, such as a thiol, aldehyde, ester, carboxylic acid, hydroxyl, or the like, wherein the functional group forms a bond with the analyte. In some cases, the polymer material may include an electron-rich or electron-poor moiety, wherein interaction between the analyte and the polymer material comprises an electrostatic interaction.

The polymer material may also be capable of biologically binding an analyte via an interaction that occurs between pairs of biological molecules including proteins, nucleic acids, glycoproteins, carbohydrates, hormones, and the like. Specific examples include an antibody/peptide pair, an antibody/antigen pair, an antibody fragment/antigen pair, an antibody/antigen fragment pair, an antibody fragment/antigen fragment pair, an antibody/hapten pair, an enzyme/substrate pair, an enzyme/inhibitor pair, an enzyme/cofactor pair, a protein/substrate pair, a nucleic acid/nucleic acid pair, a protein/nucleic acid pair, a peptide/peptide pair, a protein/protein pair, a small molecule/protein pair, a glutathione/GST pair, an anti-GFP/GFP fusion protein pair, a Myc/Max pair, a maltose/maltose binding protein pair, a carbohydrate/protein pair, a carbohydrate derivative/protein pair, a metal binding tag/metal/chelate pair, a peptide tag/metal ion-metal chelate pair, a peptide/NTA pair, a lectin/carbohydrate pair, a receptor/hormone pair, a receptor/effector pair, a complementary nucleic acid/nucleic acid pair, a ligand/cell surface receptor pair, a virus/ligand pair, a Protein A/antibody pair, a Protein G/antibody pair, a Protein L/antibody pair, an Fc receptor/antibody pair, a biotin/avidin pair, a biotin/streptavidin pair, a drug/target pair, a zinc finger/nucleic acid pair, a small molecule/peptide pair, a small molecule/protein pair, a small molecule/target pair, a carbohydrate/protein pair such as maltose/MBP (maltose binding protein), a small molecule/target pair, or a metal ion/chelating agent pair.

The analyte may be a chemical or biological analyte. The term "analyte," may refer to any chemical, biochemical, or biological entity (e.g. a molecule) to be analyzed. In some cases, the polymer material may be selected to have high specificity for the analyte.

The initiator species may be any species capable of reacting with a silicon-hydride group to activate the substrate for a subsequent polymerization reaction. For example, the initiator species may be capable of undergoing a radical reaction with a silicon-hydride group to produce a silicon radical. The initiator species may be, for example, an organic or organometallic species. In some embodiments, the initiator species may include at least one (e.g., two) terminal carbon-carbon double bond. For example, the initiator species may include at least one acrylate group, optionally substituted. In some cases, the initiator species may be in vapor-phase. In one set of embodiments, the vapor-phase initiator species is ethylene glycol diacrylate.

In some cases, the initiator species may be a thermal initiator, such as perfluorooctane sulfonyl fluoride, triethylamine, tert-butyl peroxide, tert-butyl peroxybenzoate, tert-amyl peroxide, and the like. In some cases, the initiator species may be a photoinitiator. For example, the method may involve introduction (e.g., continuous introduction) of a photoinitiator, such as 2,20-azobis(2-methylpropane), into a vacuum chamber under UV irradiation or other electromagnetic radiation. In such cases, the vacuum chamber may include, for example, a UV-transparent window instead of filaments. In other embodiments, a Type II photoinitiator, such as benzophenone, that can produce free-radical sites on the substrate surface may be employed.

The monomer species may be any species capable of undergoing a polymerization reaction under the conditions described herein. For example, the monomer species may be capable of undergoing a radical polymerization reaction. Typically, the monomer species is an organic or organometallic species. In some embodiments, the monomer species may include at least one (e.g., two) terminal carbon-carbon double bond. For example, the monomer species may include at least one vinyl group (e.g., a divinyl compound), or at least one acrylate group (e.g., a diacrylate compound), any of which is optionally substituted. In some cases, the monomer species includes at least one carbon-carbon triple bond (e.g., at least one terminal carbon-carbon triple bond). In some embodiments, the monomer species includes an optionally substituted ethynyl group. In some cases, the monomer may be a vapor-phase monomer. In one set of embodiments, the vapor-phase monomer is an alkyldiene, such as decadiene.

Examples of monomer species include, but are not limited to, acrylates (e.g., propargyl methacrylate, glycidyl methacrylate, pentafluorophenyl methacrylate, furfuryl methacrylate, hydroxyethyl methacrylate, cyclohexyl methacrylate, perfluorodecyl acrylate, methacrylic acid-co-ethyl acrylate, 2-(dimethylamino)ethyl methacrylate, ethylene glycol diacrylate), perfluoroalkenes, such as 1H, 1H, 2H perfluoroalkenes having 3 and 8 carbons, perfluorodienes, divinylbenzene, (di(ethylene glycol) di(vinyl ether), vinyl pyrrolidinone, trivinyltrimethylcyclotrisiloxane, N-isoproylacrylamide, styrenes (e.g., 4-aminostyrene, dimethylaminomethyl styrene, maleic anhydride-alt-styrene), phenylacetylene, diethynylbenzenes (e.g., meta diethynyl benzene, para diethynyl benzene), and those disclosed in Im et al., "Solvent-free modification of surfaces with polymers: The case for initiated and oxidative chemical vapor deposition (CVD)," AIChE Journal 2011, 57(2), 276-285, and U.S. Publication No. 2010/0221188, the contents of which are incorporated herein by reference for all purposes.

Some embodiments involve the use or formation of a conducting polymer. The conducting polymer may be any polymer having a conjugated pi-backbone capable of conducting electronic charge. Typically, atoms directly participating in the conjugation form essentially a plane, wherein the plane may arise from a preferred arrangement of p-orbitals to maximize p-orbital overlap, thus maximizing conjugation and electronic conduction. In some embodiments, the electron delocalization may also extend to adjacent polymer molecules. In some cases, a metal atom may be bonded to a portion of the conducting polymer. For example, the conducting polymer may comprise a metal atom, such as a transition metal, lanthanide, or actinide. Examples of conducting polymers include, but are not limited to, polyarylenes (e.g., polyphenylenes), polyheteroarylenes (e.g., polythiophene, poly(3,4-ethylenedioxy)thiophene, polypyrrole, etc.), poly(heteroarylene arylene), poly(bisthiophene phenylene), poly(arylene vinylene)s, poly(arylene ethynylene)s, substituted derivatives thereof, and transition metal derivatives thereof. Those of ordinary skill in the art would be able to identify additional conducting polymers suitable for use in the context of embodiments described herein.

Some embodiments involve the use or formation of an insulating (i.e., non-conducting) polymer. Examples of insulating polymers include, but are not limited to, polyesters, polyethylenes (e.g., polytetrafluoroethylene (PTFE)), polyacrylates, polypropylenes, epoxy, and the like. Those of ordinary skill in the art would be able to identify additional insulating polymers suitable for use in the context of embodiments described herein.

Methods described herein may be useful in various applications, including the fabricating of various organic electronic devices. In some cases, the substrate containing the polymer material may be arranged within a photovoltaic device. In some cases, the substrate containing the polymer material may be arranged within a solar cell. In some cases, the substrate containing the polymer material may be arranged within an organic light-emitting diode. In some cases, the substrate containing the polymer material may be arranged within a sensor device.

Devices fabricated using methods described herein are also provided. For example, the device may include a silicon substrate and an organic polymeric material, as described herein, formed on and attached to the substrate. In some embodiments, the organic polymeric material serves as an electrical passivation material within the device. In some embodiments, the organic polymeric material affects the optical properties of the silicon substrate. For example, the organic polymeric material may enhance the optical properties of the silicon substrate and exhibit anti-reflective properties. In some embodiments, the organic polymeric material may serve as a conducting material within the device (e.g., may comprise a conducting polymer). In some embodiments, the organic polymeric material may serve as an insulating material within the device (e.g., may comprise an insulating polymer). In some embodiments, the organic polymeric material includes a group capable of interacting with a chemical or biological analyte. The device may further include an inorganic material formed in contact with the organic polymeric material.

The device may be, for example, a photovoltaic device, a solar cell, an organic light-emitting diode, a sensor device, or the like.

Figure 7A:
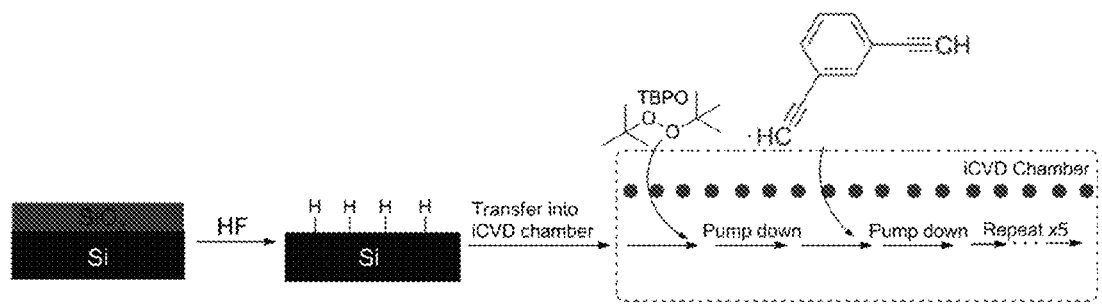
FIG. 7 shows (a) a schematic representation of a passivation procedure with multiple cycles and (b) a schematic representation of simultaneous printing of both an organic conductor material and an organic anti-reflection coating (ARC) onto an n-type Si emitter.
Figure 7B:
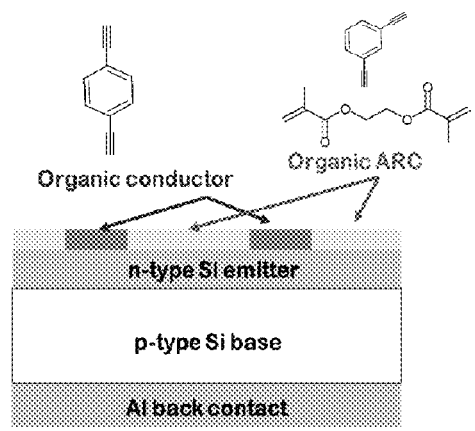

In one set of embodiments, a wafer may be transferred into an iCVD chamber after etching with HF. TBPO and meta diethynyl benzene (MDEB) or para diethynyl benzene (PDEB) may be introduced separately and sequentially into the iCVD chamber to produce monomeric ethynyl groups on the surface of the substrate and to prevent the formation of polymer. Polymeric material(s) may then be grafted onto the Si substrate by introduction of one or more vapor-phase monomer species. FIG. 7B shows an illustrative embodiment, where para diethynyl benzene (PDEB) is introduced to the passivated Si substrate to form a conducting polymer, while MDEB and a divinyl species are introduced to the passivated Si substrate to form a material having anti-reflective properties. This process may provide the ability to simplify fabrication and reduce costs by passivating the silicon and printing an organic conductor layer and an organic anti-reflection coating (ARC) in a single, low temperature step.

Chemical vapor deposition reactors are also provided. The reactor typically includes a chamber, wherein the chamber comprises a substrate, an electrode, a filament, and an inlet. In some cases, the chamber includes a plurality of filaments. The filaments may comprises a metal or other suitable material known in the art. In some cases, the filament may have a diameter of about 0.01 cm to about 0.1 cm. The filaments may be periodically spaced from the substrate and/or from one another. For example, the filaments may be spaced from about 1 mm apart to about 30 mm apart, or from about 0.1 cm to about 20 cm, from the substrate.

The reactor may further include a source of a monomer species in fluid communication with the chamber, a source of an initiator species in fluid communication with the chamber, a vacuum source operably connected to the chamber, and heat source and/or a cooling source, the heat source and/or a cooling source operably connected to the substrate. The reactor may also include controls for controlling the flow of the monomer species and initiator species. In some cases, the chamber may include a window, a door, or a lid, and/or the chamber may be substantially cylindrical in shape. The chamber may be fabricated from various materials, including glass or stainless steel. Those of ordinary skill in the art would be capable of selecting the appropriate materials for fabricating a reactor as described herein.

In some cases, the substrate may be operably connected to a DC power supply.

Those of ordinary skill in the art would be capable of selecting the appropriate materials and/or configuration of the electrode. For example, the electrode may be a microwave frequency electrode, a DC electrode, or a radiofrequency electrode. In some cases, the electrode is a radiofrequency electrode; and the radiofrequency electrode comprises a metal.

EXAMPLES

Fabrication Process: All initiated Chemical Vapor Deposition (iCVD) passivation and polymerization processes were carried out in a custom built vacuum reactor (Sharon Vacuum), as previously described in Yang et al., Chem. Mater. 2011, 23, (5), 1263-1272.

All the chemicals were used as purchased without further purification. Passivation and polymerization were performed on typically 1-10 Ωcm p-type silicon with the (100) orientation.

During Process A, tert-butyl peroxide (TBPO, Aldrich, 97%) initiator and the nitrogen patch flow were fed to the reactor at room temperature through mass flow controllers (1479 MFC, MKS Instruments) at 3 sccm and 1 sccm respectively with the total pressure of 800 mTorr and filament temperature of 312° C. for 60 minutes. The chamber was then pumped down to base pressure (~3 mTorr) for ~10 min. 1,9-decadiene (DD, Aldrich, 96%) was heated up to 45° C. in glass jar and delivered into the reactor using needle valves with the total pressure of 800 mTorr and without filament heating for 20 minutes. The TBPO-pump-DD-pump cycle was then repeated for 5 times but with shorter cycle lengths: TBPO (10 min)-pump (2 min)-DD (10 min)-pump (2 min) The silicon wafer is kept at 20° C. throughout the process.

During Process B, TBPO and ethylene glycol diacrylate (EGDA, Aldrich, 98%) were introduced into the chamber simultaneously as reported previously in Yague et al., Soft Matter 2012, 8, (10), 2890-2894. Films were deposited at a filament temperature of 250° C. and a stage temperature of 20° C. Total pressure in the vacuum chamber was maintained at 0.215 torr for all depositions. In situ interferometry with a 633 nm HeNe laser source (JDS Uniphase) was used to monitor the film growth and deposit desired thicknesses on Si substrates. A more accurate film thickness on the Si wafer substrates was measured post-deposition using a J. A. Woollam M-2000 Variable Angle Spectroscopic Ellipsometry (VASE) at three different incidence angles (65°, 70°, 75°) using 190 wavelengths from 315 to 718 nm. The data were fit using a Cauchy-Urbach model.

Characterization Methods: The X-ray photoelectron spectroscopy (XPS) spectra were obtained on a Kratos Axis Ultra spectrometer with a monochromatized Al KR source, operated at 150 Watts. The pass energy and step size was 20 eV and 100 eV. The nano-scratching was performed on Nanovea Ergonomic Workstation and the scratching procedure was designed based on ASTM C1624, ASTM D7027 & ASTM G171. The scanning electron microscope (SEM) images were obtained by JEOL J5M-6700F with acceleration voltage of 10 kV. The lifetime measurements were conducted based on Quasi-Steady State Photoconductance (QSSPC) technique with Sinton WCT-120 apparatus. The Spatially resolved photoluminescence images were obtained by exciting the Si with an 822 nm laser while recording a 20 second exposure image with a charge-couple device (CCD) camera. A 1000 nm longpass filter was used to select the band-edge emission of Si. The surface roughness was measured using atomic force microscope (AFM, Veeco, Nanoscope V with Dimension 3100). Tapping mode was employed to prevent damage to the surface morphology.

Calculation of the reactivity of 1,9-decadiene: The $k_p$ of 1,9-decadiene (10 L mol$^{-1}$ s$^{-1}$) is estimated from the $k_p$ of propylene [19], assuming the two vinyl groups in 1,9-decadiene have the same reactivity as that in prolylene.

Example 1

In this example, a rapid, simple and cost-effective method for forming an air-stable organic passivation layer was investigated. The approach utilized a variant of initiated CVD (iCVD), which operates under dry conditions for depositing organic layers, and represents a low temperature analog to the CVD utilized for SiN$_x$ passivation. The degradation of the passivation layer caused by solvents may thus be prevented. The iCVD method also creates layers of nano-scale thickness which serve other functions in the device, such as ARC. The scale-up of the iCVD process has been demonstrated in a roll-to-roll system, which is compatible with the existing infrastructures in semiconductor industries. The iCVD passivation layer, even after 200 hours of air exposure, provides superior passivation performance with a SRV ~10 cm s$^1$.

The passivation procedure is shown in FIG. 2A where a wafer is transferred into iCVD chamber within 3 min after HF etching is completed. In "Process A," TBPO and DD are introduced separately to prevent the formation of polymer. A vapor mixture of TBPO and EGDA is used in "Process B," which results in iCVD polymerization. With the surface vinyl groups generated during Process A, the polymer is grafted onto the Si substrate; otherwise only dispersion forces present between the polymer film and the substrate. FIG. 2B shows the Si (2p) XPS spectrum of the surface resulting from Process A. The samples were exposed to air prior to XPS measurements, but the growth of oxide was inhibited by the iCVD passivation. FIG. 2C shows the reflection spectrum of the surface resulting from Process B. The 200 nm ARC was grafted on Si via iCVD passivation layer. The reflection at the wavelength with maximum solar irradiance was suppressed.

Figure 3:
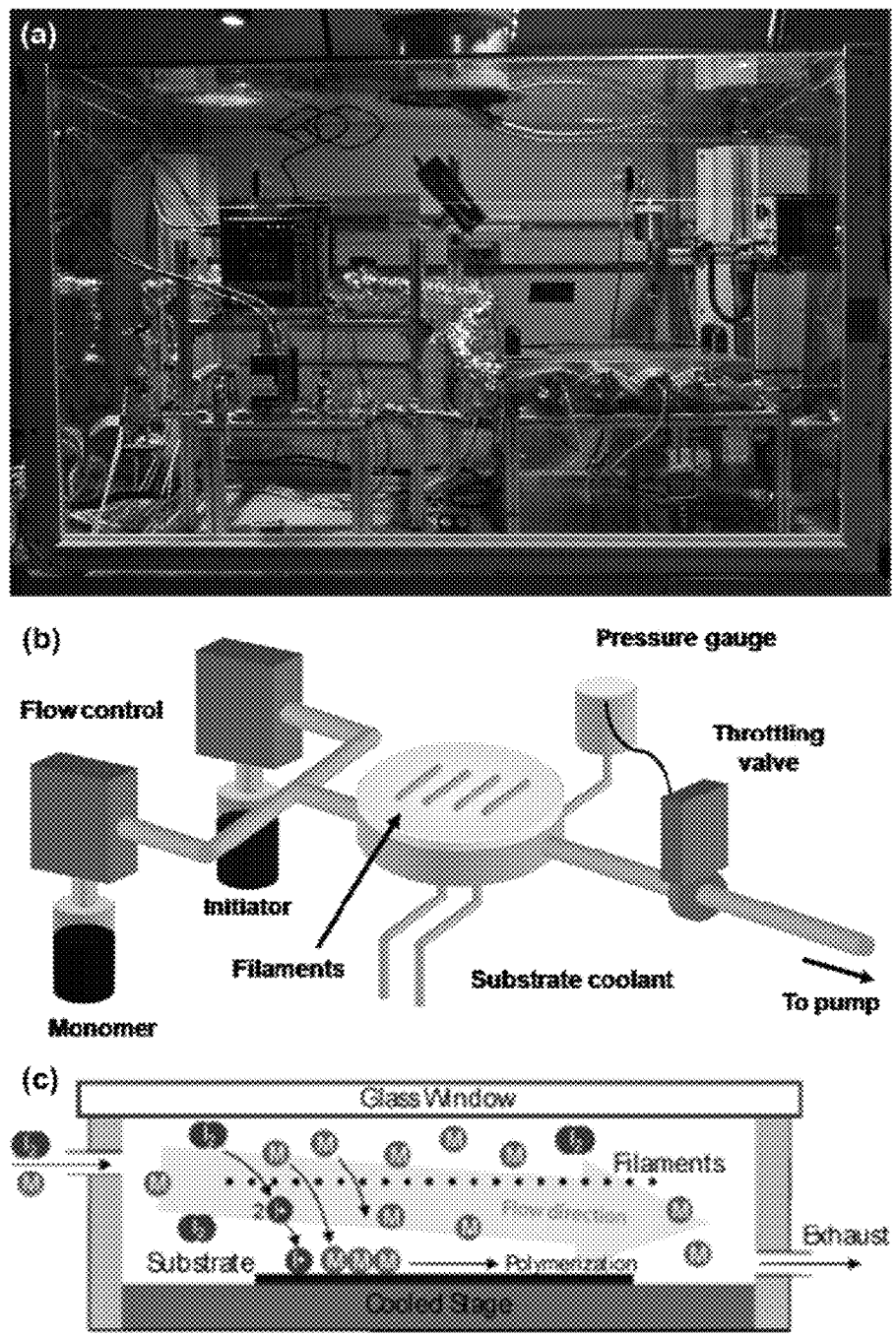
FIG. 3 shows (a) a photograph of the iCVD system used in Example 1; (b) a schematic of the iCVD system; (c) a schematic of the cross-section of iCVD system.

FIG. 3A shows a photograph of the iCVD system used in this example. FIG. 3B shows a schematic of the iCVD system, as published in Baxamusa et al., Physical Chemistry Chemical Physics 2009, 11, (26), 5227-5240. Following the HF etching of the native silicon oxide to obtain surface hydride, the iCVD passivation was carried out in a single vacuum chamber, as shown in FIGS. 3A and 3B at modest vacuum (~0.1 to 1 torr) and low substrate temperatures (20° C.), with two types of vapor phase reactants: (i) the initiator tert-butyl peroxide (TBPO) and (ii) a vinyl monomer 1,9-decadiene (DD). While traditional iCVD process deliver the molecules simultaneously to obtain a polymeric layer via free-radical polymerization, the method described herein was focused on the reaction between the surface hydride and the vinyl groups of the vapor-delivered monomers was promoted. As such, formation of a first layer of iCVD polymer was minimized or prevented as it would simply cover the surface hydride groups, without allowing them to react with the monomers. Therefore, to prevent polymerization during Process A, TBPO and DD were fed into the chamber sequentially, and the chamber was pumped down to 3 mTorr between the initiator and monomer cycles to minimize the simultaneous presence of the two reactants. The filament array provided the thermal excitation needed to break the labile bonds in the initiator and generates free radicals. The substrate was kept under room temperature by substrate coolant, and the pressure of the chamber was controlled by throttling valve.

FIG. 3C shows a schematic of the cross-section of iCVD system, as published in Tenhaeff et al., Advanced Functional Materials 2008, 18, (7), 979-992. The TBPO vapors broke down upon passing the heated filaments and free-radical polymerization was initiated on the substrate with the surface-physisorbed monomers. In previous studies, two types of radicals were observed upon the thermal decomposition of TBPO in an iCVD reactor. The dominant free radical species was tert-butyl oxide (TBO) at the filament temperature Tf>150° C.; while at Tf>270° C., TBO undergoes β-scission to produce methyl radicals. Interestingly, all samples exhibiting high-quality and air-stable passivation behavior generally required exposing the silicon wafer to TBPO pyrolyzed at filament temperatures greater than 300° C. as the first step. Prolonged exposure to vinyl monomers alone or simultaneous delivery of TBPO and vinyl monomers with the filament heating did not, in this example, result in good passivation. Without wishing to be bound by theory, this can be explained by the greater reactivity of methyl radicals, which can possibly "activate" Si—H moieties by H-abstraction. Notably, the filament was heated resistively with a typical current value of 1-2 Amp for a total power of 0.0086-0.0343 Watts cm$^{-2}$. The Si wafer was kept at 20° C. throughout the passivation process to ensure low energy consumption.

iCVD can utilize essentially any monomer that can be activated by a free radical. The traditional iCVD polymerization process has been used to fabricate functionalized surfaces with a wide variety of useful moieties, such as amine, hydroxyl, and vinyl. This example focuses on a vinyl functionalized surface, which is a versatile platform for subsequent functionalization via free radical polymerization. The non-branched di-vinyl monomer, decadiene (DD), has linear structure, which minimizes the steric hinderence and improves the coverage on surface Si atoms. DD was chosen among other terminal dienes because it has the appropriate volatility and can be vaporized and delivered into the iCVD chamber at a moderate temperature. Although the relatively low reactivity ($k_p$~10 L mol$^{-1}$ s$^{-1}$) and high sensitivity to contaminants of DD required exceptional cleanliness throughout the process, the lowest minority carrier SRV reported to date has been obtained with iCVD DD passivation among the air-stable organic passivations. The initiator-monomer cycles were repeated for 5 times to obtain higher surface coverage.

The oxidation of the silicon substrate has been an issue for many organic passivation methods. A low-quality passivation leaves unreacted surface dangling bonds that are susceptible to oxidation; unstable passivation layers, such as Si—O—R, are replaced by the native silicon oxide layer upon exposing to air. To determine the protection against oxidation by the iCVD passivation method, XPS was used and focused on the high resolution Si (2p) scan for the presence of oxide peaks on the samples treated with Process A. The film thickness at the end of Process A was estimated to be less than 6 nm based on the information depth in the XPS measurements (~63% of electrons collected are from <2 nm depth into the film; ~30% from 2-4 nm and ~5% from 4-6 nm). The representative XPS Si (2p) high-resolution scan on the passivated samples after exposure to air is shown in FIG. 2B. The binding energy of $SiO_x$ was ~104 eV, while that of non-oxidized silicon was around 100 eV. No significant silicon oxide peak was observed on the iCVD-passivated silicon samples. The double peak around 100 eV was due to the spin orbit splitting of the covalent Si 2p (3/2 and 1/2), confirming that the vinyl-functionalized passivation layer was thin enough to permit detection of the silicon wafer substrate.

Figure 4:
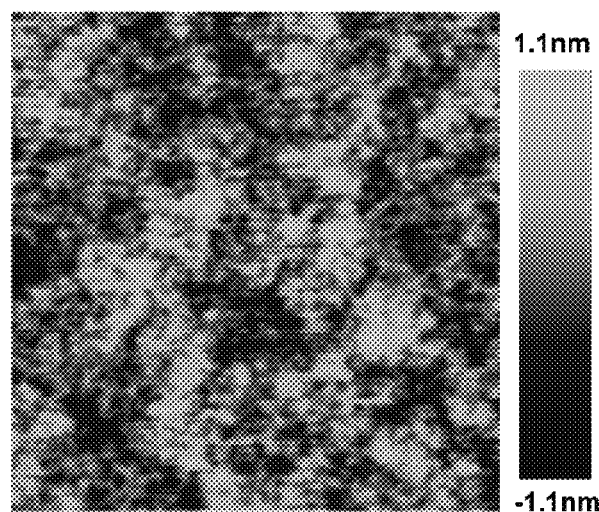
FIG. 4 shows an atomic force microscopy (AFM) image of 200 nm PEGDA film grafted on silicon substrate via iCVD 1,9-decadiene passivation, with an RMS roughness of 0.28±0.04 nm.

Following Process A, a poly(ethylene glycol diacrylate) (PEGDA) layer with the thickness of 200-700 nm was deposited in situ via traditional iCVD polymerization on DD-passivated silicon wafers (denoted as "Process B" in FIG. 2A). The roughness of 200 nm-PEGDA coating was ~0.3 nm, as shown in FIG. 4. The smoothness of the film allowed for control of the reflectivity and, thus, a passivation-ARC was achievable by this simple scheme. The reflection spectra of 200 nm PEGDA coatings on passivated Si are shown in FIG. 2C, where the reflection was suppressed effectively at the wavelength with the maximum solar irradiance.

The PEGDA film was covalently grafted to the silicon substrate through the surface vinyl groups generated by Process A, and nano-scratching tests provide a qualitative evaluation of the strength of this adhesion. A ramping load scratch was performed from 0.01 to 0.5 mN on 660 nm PEGDA-coated samples to observe the possible delamination events.

Figure 5:
FIG. 5 shows (a)-(b) nano-scratching images and (c)-(d) cross-sectional SEM images of ARC, which is deposited by Process B alone (i.e., traditional iCVD polymerization) in (a) and (c) and a combination of Process A and B in (b) and (d). The scale bars represent 7 μm in (a) and (b) and 1 μm in (c) and (d).

FIG. 5A shows an image of multiple delamination events that occurred on a non-passivated sample, for which the ARC was grown onto a clean wafer via Process B (i.e., traditional iCVD) in absence of Process A, with only dispersion forces present between the polymer film and the substrate. The spiral patterns were indications of poor adhesion to the substrate and delamination of the coating. In the same load range, the scratches on the samples treated with both Process A and B are shown in FIG. 5B, where no delamination events were observed. This was an indication of the high coverage and good uniformity of the passivation produced in Process A. The adhesion of the passivation-ARC was also verified by the scanning electron microscope (SEM) imaging on the sample cross-section. Delamination of the polymer coating as shown in FIG. 5C was common due to the mechanical stretching and tearing during the SEM sample preparation. For the passivated samples, as shown in FIG. 5D, such delamination was not observed because the coating was covalently bounded to the substrate.

In addition to the promoting adhesion and protecting devices against oxidation, a high-quality electronic passivation should also reduce the number and cross section of the surface minority charge carrier recombination sites. The rate of the minority carriers' surface recombination is quantified by SRV, which can be calculated from minority carrier lifetime (MCL) measurements using the Quasi-Steady State Photoconductance (QSSPC) technique with Sinton WCT-120 apparatus. The current configuration of the iCVD passivation tool enables only single-sided coating. Thus, to allow the measurement of the MCL at the Si-polymer interface, the back side of each wafer was passivated with a thick (~700 nm) layer of PECVD-grown $SiN_x$. Therefore, the effective (measured) lifetime is affected by minority carrier recombination at both the back and front surfaces, and the two are decoupled using a common-reference method described forthwith. Following the deposition of the $SiN_x$ coating on one side of the wafer, the wafer was etched with 1% HF solution without removing the $SiN_x$ layer, and treated with 0.1 M E-I solution. The minority carrier lifetime of the E-I passivation was measured instantly. This process captures the bulk and back-surface recombination, which can later be subtracted to extract the effect of the iCVD passivation using the following relation:

$$\frac{1}{\tau_{iCVD}} = \frac{1}{\tau_{I-E}} + \frac{2(S_{iCVD} - S_{I-E})}{d} \quad (1)$$

where $\tau_{iCVD}$ (or $\tau_{I-E}$) is the effective (measured) lifetime of the iCVD (or E-I) passivation; S is the SRV; and d is the thickness of the wafer. After the measurement, the E-I solution was cleaned off by standard RCA and HF etching procedure. The wafer was transferred into the iCVD chamber within 3 minutes to be treated with Process A followed by Process B.

Figure 6:
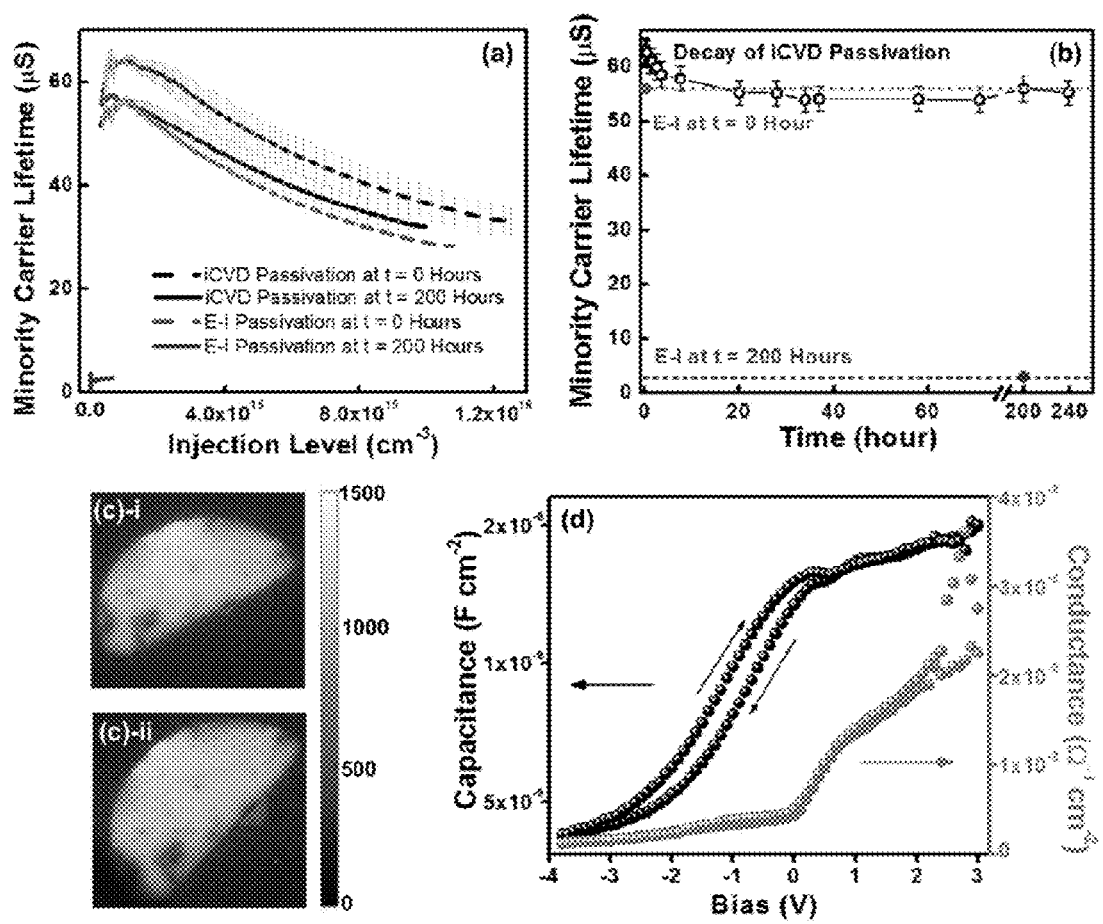
FIG. 6 shows (a) a plot of injection-dependent minority carrier lifetimes; (b) time-dependent decay of lifetimes at the injection level of $\Delta n=1.0\times10^{15}$ cm-3, of iCVD and E-I passivation; (c) photoluminescence images of (i) a sample, as-passivated sample by iCVD method and (ii) the same sample after 200 hours in lab ambient; and (d) capacitance and conductance of an Al/iCVD PEGDA/n-Si/InGa stack as a function of bias voltage, taken at 30 kHz.

FIG. 6A shows a plot of average injection-dependent minority carrier lifetimes, and FIG. 6B shows the time-dependent decay of lifetimes at the injection level of $\Delta n=1.0\times 1015$ cm-3, of iCVD and E-I passivation. The instant lifetimes after the iCVD passivation are superior to those observed after the E-I passivation at all injection levels (after 200 hours in air, E-I passivation was nonexistent, while the iCVD sample lifetime decayed only slightly), indicating that the iCVD DD passivation is able to achieve <10 cm s$^{-1}$ surface recombination velocities. This is equivalent to, if not better than, the best results for organic passivation of silicon. The error bars in FIG. 6A indicate the standard deviations between two iCVD passivation runs. The passivated samples were kept in the lab ambient for more than 200 hours and a slight decrease in the minority carrier lifetime was observed. (FIGS. 6A-B) After 200 hours of storage, the lifetimes of iCVD passivation at all injection levels were better than or comparable to the E-I passivation at t=0 hour. FIG. 6B demonstrates the time-dependent decay of lifetimes at the injection level of $\Delta n=1.0\times 10^{15}$ cm$^{-3}$ for both passivation methods. After ~15 hours, the lifetime of the iCVD passivations stabilized around 56 μs, which is comparable to the E-I control at t=0 hour (dotted line in FIG. 6B, implying that the surface recombination velocity remains around 10 cm s$^{-1}$. However, the E-I passivation had un-detectable lifetime after t=200 hours at the injection level of $\Delta n=1.0\times 10^{15}$ cm$^{-3}$. The lifetime at the injection level of $\Delta n=0.7\times 10^{15}$ cm$^{-3}$ is plotted in FIG. 6B instead, which was around ~3 μs. This observation suggested an excellent quality and stability of the iCVD passivation method.

Camera-based photoluminescence imaging (PLI) evaluates the minority carrier lifetime distribution across the wafer, revealing the surface passivation uniformity. PLI measurements were obtained via s standard measurement practice. FIG. 6C shows photoluminescence images of a sample (i) as-passivated sample by iCVD method, and (ii) after 200 hours in lab ambient. The images show relatively uniform luminescence across the entire wafer piece, indicating good passivation uniformity. After 200 hours of air exposure, the qualitative features of the PLI measurement as well as the overall intensity remain largely unchanged, further indicating the robustness of the surface passivation.

Finally, one of the many possible applications of the silicon-polymer thin film structure was demonstrated. Parts of a field-effect transistor (FET) device were fabricated using iCVD passivation and tested via capacitance-voltage (C-V) measurements. After Process A and B, 0.28 mm$^2$ Al pads were evaporated onto the surface of the polymeric layer using a shadow mask. The nitride layer was scratched and an InGa eutectic was used to make a back contact. FIG. 6D shows the capacitance and conductance of the Al/iCVD PEGDA/n-Si/InGa stack as a function of bias voltage, taken at 30 kHz. The capacitance-voltage curve (FIG. 3d) shows the characteristic behavior of a Metal-Insulator-Semiconductor (MIS) capacitor structure that can be driven from accumulation to depletion. This indicated the absence of a large density of interfacial states that may pin the Fermi level to a position in the mid-gap of silicon. When the structure was driven into accumulation (positive bias), the Si bands bend downward at the Si-polymer interface, accumulating electrons near it. The measured capacitance was that of the polymer film alone, and conductance was controlled by leakage of electrons through it. When the structure was driven into depletion, the capacitance measured was that of the polymer film and the depletion region. Here, the conductance was further limited by the transport of electrons through the depletion layer, which lengthened with increased bias. A small but noticeable hysteresis was observed, possibly suggesting the presence of a small concentration of charged interface states; perhaps these are the same states that give rise to a finite SRV.

In conclusion, a strategy of using an iCVD method to passivate a silicon hydride surface and to grow robust organic surface films with several hundred nanometers thickness was demonstrated. Estimates of the SRV obtained using iCVD-grafted DD were at or below 10 cm s$^{-1}$, comparable to if not lower than the best air-stable organic passivations of Si to date. Atop this functionalized silicon surface, organic films can be grown to several hundred nanometers thick and exhibit robust adhesion to the silicon surface; iCVD-deposited PEGDA films can resist spalling in nano-scratch tests. Preliminary observations suggest air-stable surface passivation up to 200 hours. The simple reaction, commercially available and inexpensive reactants, and relatively mild reaction conditions render it feasible to be incorporated into the existing semiconductor fabrication infrastructure. This method therefore offers a practical solution to the various problems existing in the fast-developing organic electronics and PV industry. Functionalities other than the vinyl moiety are possible via the iCVD passivation method. Minimal or no modifications to the passivation procedure should be required for other monomers. Dual-side iCVD-deposited wafers may also be obtained using these methods.

Example 2

Figure 8A:
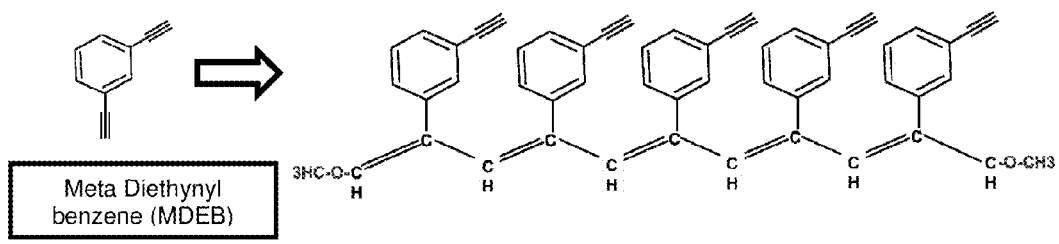
FIG. 8 shows (a) the polymerization of meta diethynyl benzene (MDEB); (b) the polymerization of para diethynyl benzene (BDEB); (c) a plot of conductivity of polymeric MDEB and PDEB films as a function of monomer/initatior ratios; (d) plot of transmission of PDEB films as a function of monomer/initatior ratios; (e) plot of FTIR spectra of PDEB films as a function of monomer/initatior ratios; and (f) a plot of minority carrier lifetimes (μs) for iCVD grafted polymeric MDEB films at substrate temperature of 25° C.
Figure 8B:
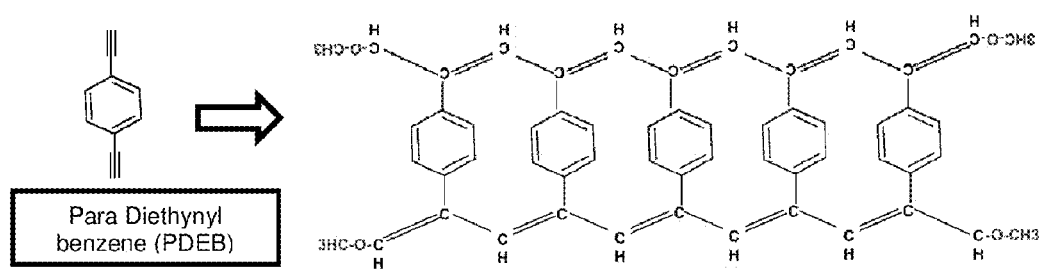
Figure 8C:
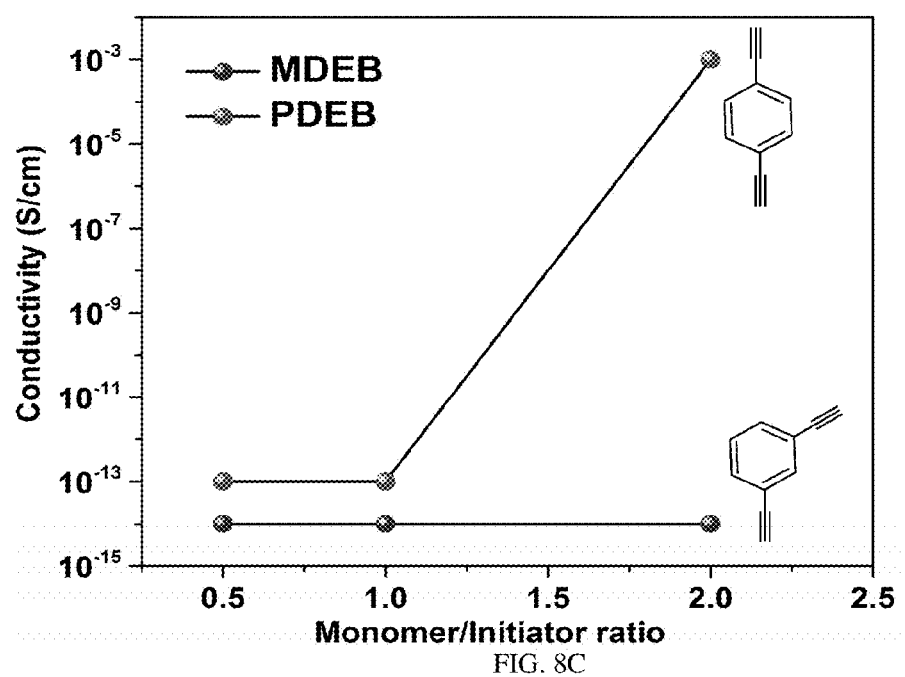
Figure 8D:
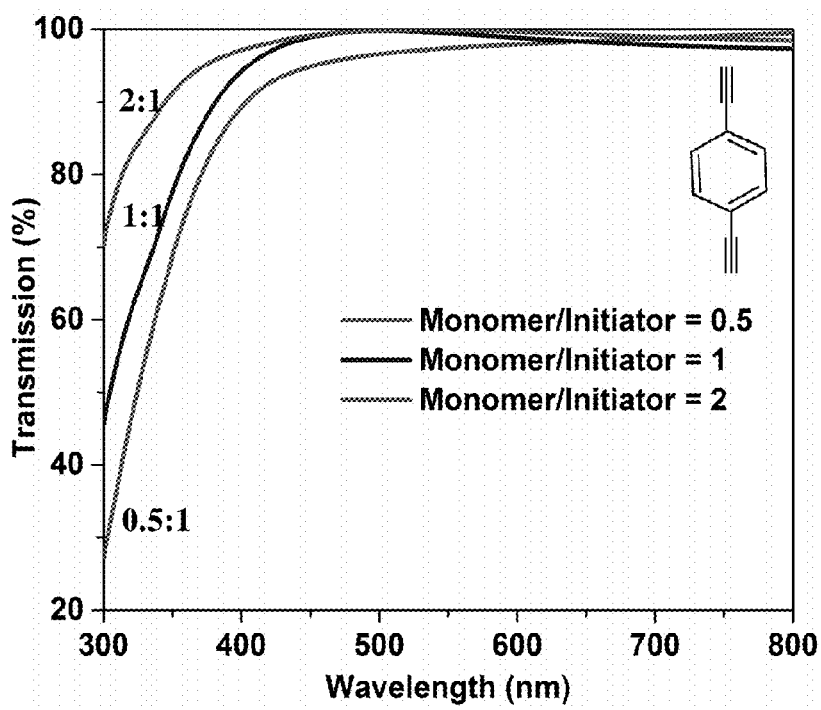
Figure 8E:
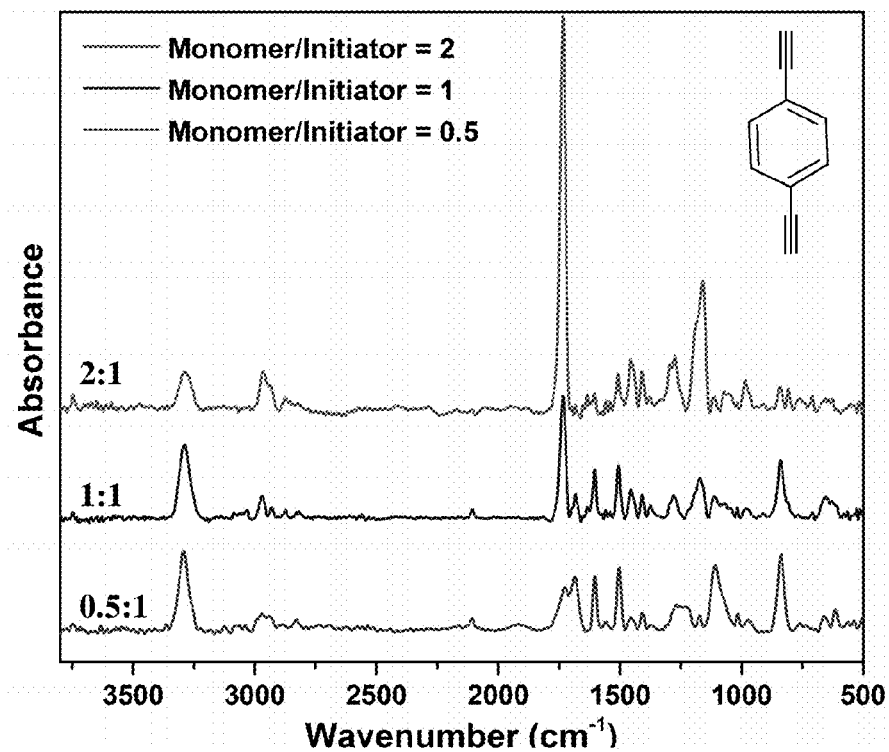

In this example, iCVD was utilized to passivate silicon surfaces with insulating and conducting polymers produced using meta diethynyl benzene (MDEB) and para diethynyl benzene (PDEB), respectively. FIGS. 8A and 8B show MDEB and PDEB, respectively, which were polymerized via iCVD and used to produce both insulating films (e.g., for use in ARC applications) or conducting films (e.g., for use in current collector grids). Polymeric PDEB films grown via iCVD were intrinsically conducting, as shown in FIG. 8C, whereas polymeric MDEB films were insulating even after doping. Pristine iCVD-grown polymeric PDEB films can also be chemically doped to increase conductivity by, for example, exposure to iodine vapors, aqueous solutions of acids like HBr, or by other methods known in the art. Additionally, FIG. 8D demonstrates that polymeric PDEB films were transparent within the visible spectrum at monomer to initiator ratios of 0.5, 1, and 2. The conductivity of PDEB films (FIG. 8C) may be optimized by varying the monomer to initiator flow ratios. The spectra in FIG. 8E compare the evolution of the IR absorption peaks of PDEB films at monomer to initiator ratios of 0.5, 1, and 2.

Figure 8F:
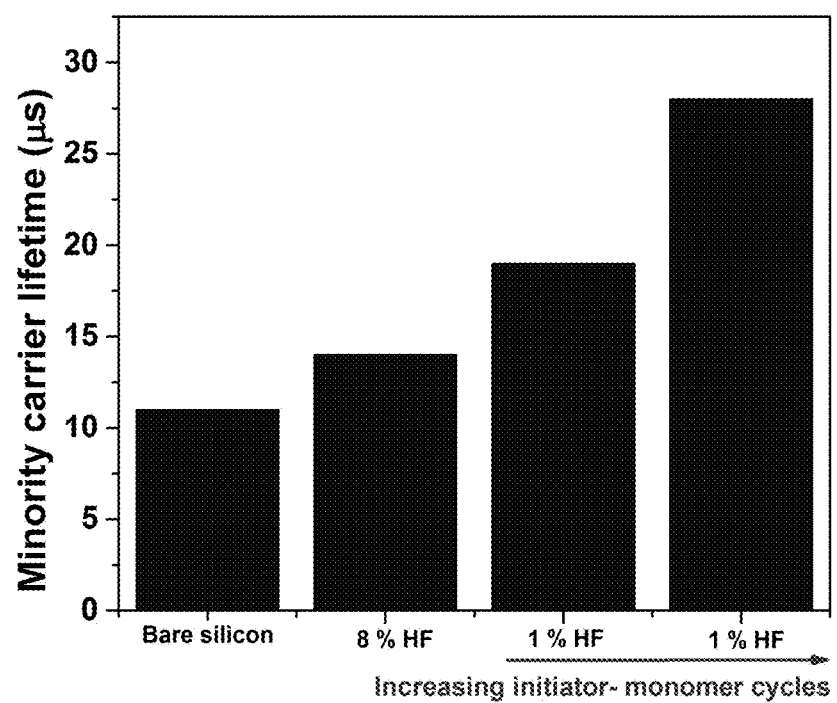

The polymeric PDEB and MDEB films were fabricated using methods described herein. As shown in FIG. 7A, a wafer was transferred into an iCVD chamber after etching with HF. TBPO and MDEB were introduced separately and sequentially into the iCVD chamber to produce a grafted polymeric MDEB film on the surface of the substrate. Similarly, TBPO and PDEB were introduced separately and sequentially into the iCVD chamber to produce a grafted polymeric PDEB film on the surface of the substrate. Grafted polymeric MDEB films on silicon surface by iCVD, as schematized in FIG. 7A, showed increased minority carrier lifetimes. Higher lifetimes can lead to lower surface recombination velocities. Increasing initiator-monomer cycles, as shown in FIG. 8F, demonstrated that iCVD-grafted polymeric MDEB films grown at a low substrate temperature of 25° C. showed a minority carrier lifetime of ~30 µs, as compared to PECVD grown SiN layers deposited at a significantly higher substrate temperature of 375° C., which typically show a minority carrier lifetime of ~80 µs.

Having thus described several aspects of some embodiments of this invention, it is to be appreciated various alterations, modifications, and improvements will readily occur to those skilled in the art. Such alterations, modifications, and improvements are intended to be part of this disclosure, and are intended to be within the spirit and scope of the invention. Accordingly, the foregoing description and drawings are by way of example only.

What is claimed:

1. A method for passivating a substrate, comprising:
    exposing a surface of a substrate comprising silicon-hydride groups to a vapor-phase initiator species under conditions which facilitate a radical reaction between at least a portion of the silicon-hydride groups and the vapor-phase initiator species; and
    exposing the surface of the substrate to a vapor-phase monomer species under conditions which facilitate polymerization of the monomer species, thereby producing a polymer material covalently attached to the surface of the substrate, wherein the vapor-phase monomer species is decadiene, meta diethynyl benzene, or para diethynyl benzene.

2. A method as in claim 1, wherein the radical reaction comprises hydride extraction from the silicon-hydride groups, producing silicon radicals.

3. A method as in claim 1, further comprising:
    exposing the silicon radicals to a vapor-phase monomer species under conditions which facilitate reaction between at least a portion of the silicon radicals and vapor-phase monomer species and polymerization of the monomer species, thereby producing a polymer material covalently attached to the surface of the substrate.

4. A method as in claim 1, wherein the vapor-phase initiator species and vapor-phase monomer species are exposed to the substrate sequentially.

5. A method as in claim 1, wherein the vapor-phase initiator species is an organic or organometallic species.

6. A method as in claim 1, wherein the vapor-phase initiator species comprises at least one terminal carbon-carbon double bond.

7. A method as in claim 1, wherein the vapor-phase initiator species comprises at least one acrylate group, optionally substituted.

8. A method as in claim 1, wherein the vapor-phase initiator species is ethylene glycol diacrylate.

9. A method as in claim 1, wherein exposure of the substrate to the vapor phase monomer species is performed in the absence of a solvent.

10. A method as in claim 1, wherein exposure of the substrate to the vapor-phase monomer species is performed at a temperature below 500° C.

11. A method for passivating a substrate, comprising:
forming a polymer material on the surface of a substrate comprising silicon-hydride groups by exposure of the substrate to a monomeric species at a temperature of about 500° C. or less,
wherein the polymer material is covalently bonded to the surface of the substrate, and wherein the monomeric species is decadiene, meta diethynyl benzene, or para diethynyl benzene.

12. A method as in claim 11, wherein the polymer material has a thickness in the range of about 10 nm to about 10 microns.

13. A method as in claim 11, wherein the polymer material comprises a conducting polymer.

14. A method as in claim 11, where in the polymer material comprises an insulating polymer.

15. A method as in claim 11, wherein the polymer material is an anti-reflective coating.

16. A method as in claim 11, wherein the substrate comprising the polymer material is arranged within a photovoltaic device.

17. A method as in claim 11, wherein the substrate comprising the polymer material is arranged within a solar cell.

18. A method as in claim 11, wherein the substrate comprising the polymer material is arranged within an organic light-emitting diode.

19. A method as in claim 11, wherein the substrate comprising the polymer material is arranged within a sensor device.

20. A method for passivating a substrate, comprising:
forming a polymer material on the surface of a substrate comprising silicon-hydride groups by exposure of the substrate to a monomeric species in the absence of a solvent,
wherein the polymer material is covalently bonded to the surface of the substrate, and wherein the monomeric species is decadiene, meta diethynyl benzene, or para diethynyl benzene.

* * * * *